United States Patent [19]
Chen

[11] Patent Number: 5,858,849
[45] Date of Patent: Jan. 12, 1999

[54] METHOD OF MANUFACTURING SELF-ALIGNED SILICIDE

[75] Inventor: Tung-Po Chen, Taichung, Taiwan

[73] Assignee: United Microelectronics Corp., Hsin-Chu, Taiwan

[21] Appl. No.: 47,903

[22] Filed: Mar. 25, 1998

[30] Foreign Application Priority Data

Jan. 15, 1998 [TW] Taiwan ................................. 87100472

[51] Int. Cl.$^6$ ................................................. H01L 21/265
[52] U.S. Cl. ......................... 438/305; 438/592; 438/466; 438/520
[58] Field of Search ..................... 438/301, 305, 438/592, 466, 520

[56] References Cited

U.S. PATENT DOCUMENTS

| | | |
|---|---|---|
| 4,764,394 | 8/1988 | Conrad . |
| 4,908,334 | 3/1990 | Zuhr et al. . |
| 5,122,479 | 6/1992 | Audet et al. . |
| 5,508,227 | 4/1996 | Chan et al. . |
| 5,665,646 | 9/1997 | Kitano ...................................... 438/592 |

*Primary Examiner*—Richard A. Booth
*Attorney, Agent, or Firm*—Christie, Parker & Hale, LLP

[57] ABSTRACT

The present invention disclose a salicide process with a self-preamorphization step to reduce the sheet resistance of the source/drain region. The salicide process, comprising the steps of performing a pre-amorphization step on the surface of the silicon and simultaneously forming a metal layer, further contains the substeps of applying a back bias to the bottom of the substrate, using ion metal plasma to transform the surface of the substrate into amorphous silicon, forming a metal layer on the surface of the substrate and then using a thermal process having two stages to transform the metal into the salicide.

9 Claims, 4 Drawing Sheets

METHOD OF MANUFACTURING SELF-ALIGNED SILICIDE

CROSS-REFERENCE TO RELATED APPLICATION

This application claims the priority benefit of Taiwan application serial no. 87100472, filed Jan. 15, 1998, the full disclosure of which is incorporated herein by reference.

BACKGROUND OF THE INVENTION

Field of the Invention

The invention relates in general to the improvement of the self-aligned silicide (Salicide) process, and more particularly to a process which combines the salicide process and a self-preamorphization process.

As the level of integration for MOS devices increases, resistance in the source/drain terminals of the MOS device gradually rises to a value comparable to the channel resistance of the MOS device. To ensure integrity at the shallow junction between metallic contacts and the MOS terminals, and for the downward adjustment of sheet resistance in the source/drain terminals, self-aligned silicide processes are now employed in the manufacturing of very large scale integrated (VLSI) and ultra large scale integrated (ULSI) circuits. However, the thermal stability of $TiSi_2$ with narrow line is easily degraded by the thermal budget and $TiSi_2$ thickness. Therefore, it is difficult to obtain a low sheet resistance and high uniformity Ti-salicide with narrow line (<0.5 μm). Pre-amorphization implantation has been reported to improved the resistance of $TiS_2$. However, an additional implantation is needed for this technique, and cost is increased by this implantation.

One of the conventional methods to obtain a low sheet resistance comprises implanting arsenic (AS) or Argon (Ar) atoms into the surface of the amorphous silicon, and then performing a self-aligned silicide process, as shown in FIG. 1A–FIG. 1D.

First, as shown in FIG. 1A, a semiconductor substrate 10 is provided, and shallow trench isolation regions 12 and MOS transistors 10' are formed above the substrate 10. The MOS transistors 10' consisting of gate electrodes 18, spacers 16 formed around the periphery of the gate electrodes 18 and source/drain regions 14 formed near the surface of the substrate 10 and around the periphery of the gate electrodes 18. The spacers 16 can be made from material such as dielectric compound.

Next, in FIG. 1B, the surface of source/drain regions 14 are transformed into amorphous phase by implanting As or Ar atoms into the substrate 10 using gate electrodes 18 as masks. Thus, the thickness of the titanium metal formed in the subsequent process can be controlled and the resistance of the titanium silicide can be improved by this amorphous surface. However, this additional implantation step increases the cost of the process.

Next, referring to FIG. 1C, a layer of titanium metal 28 is deposited, for example, using magnetically controlled DC sputtering method, over the surface of the semiconductor substrate 10 to a thickness of about 200~1000_. Because the amorphous surface is pre-formed in the surface 24 of the source/drain regions 14, the titanium metal will not penetrate deeply into the source/drain regions 14, effectively controlling the resistance of the interface.

Next, in FIG. 1D, a layer of titanium silicide is formed at the interface between the titanium and silicon. Namely, a layer of titanium silicide 28a is formed on the surface of the source/drain regions 14 to reduce the sheet resistance of the source/drain regions 14. Meanwhile, a titanium silicide layer 28b is formed by using a rapid thermal process (RTP) which has two stages. The early titanium silicide is formed by using a rapid thermal anneal (RTA) with nitrogen gases at a temperature of about 600°~650° C. in the first stage. Then, the unreacted titanium metal and the titanium nitride formed by the reaction between the titanium metal and nitrogen gases are removed, for example, by using a RCA cleaning solution. The RCA cleaning solution consists of $NH_4OH$/HDIW (Hot De-ionization Water)/$H_2O_2$. The temperature is raised to about 800°–900° C. and the RTA process is performed with nitrogen gases to transfer the phase of the titanium silicide from $C_{49}$ to $C_{54}$ in the second stage. The titanium silicide is formed by the diffusion and chemical reaction between the titanium and silicon. Because of the low resistance of the titanium silicide, the ohmic contact formed at the interface between titanium and silicon will be excellent.

As the size of the device is diminished, a conventional pre-amorphous implantation process is performed to obtain a low sheet resistance and high uniformity titanium silicide with narrow line. However, this additional implantation step will increases the cost of the process.

SUMMARY OF THE INVENTION

It is therefore an object of the invention to provide an improved and simplified salicide process with a self-preamorphization step. It is not necessary to perform an additional implantation process in the present invention, and the silicon surface of the pre-determinated region of the salicide can be amorphized simultaneously with the deposition of titanium metal.

The invention achieves the above-identified objects by providing a new salicide process with a self-preamorphization step. This salicide process can be applied to a device of a semiconductor substrate, the device comprising a device isolation region, a gate electrode, a spacer formed at a sidewall of the gate electrode and a source/drain region formed near the surface of the substrate and around the periphery of the gate electrode. This process comprises the steps of: forming a metal layer over the surface of the semiconductor substrate, which includes applying a back bias to the bottom of the semiconductor substrate and applying ion metal plasma, thereby transforming the surfaces of the gate electrode and source/drain region into amorphous phase and simultaneously forming the metal layer on the surface of the semiconductor substrate, and then performing a thermal process to form the salicide on the surfaces of the gate electrode and source/drain region.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
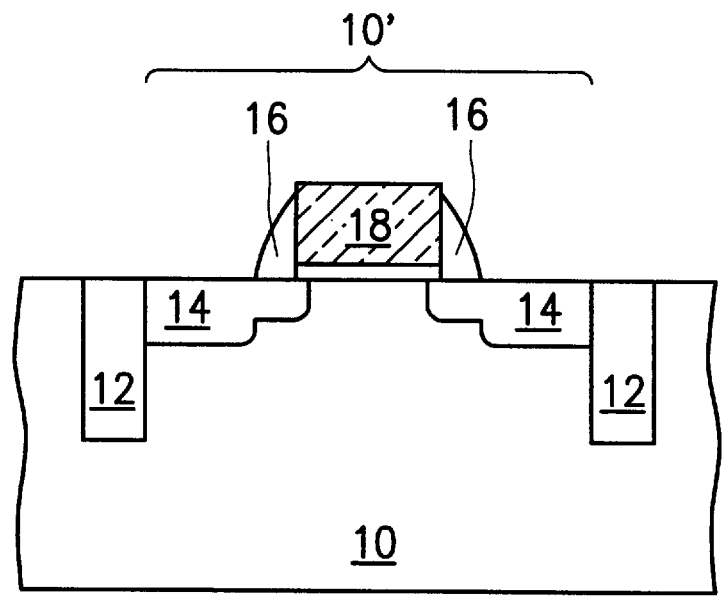
FIGS. 1A to 1D (Prior Art) are cross-sectional views showing a conventional process for reducing the sheet resistance of the source/drain regions.
Figure 1B:
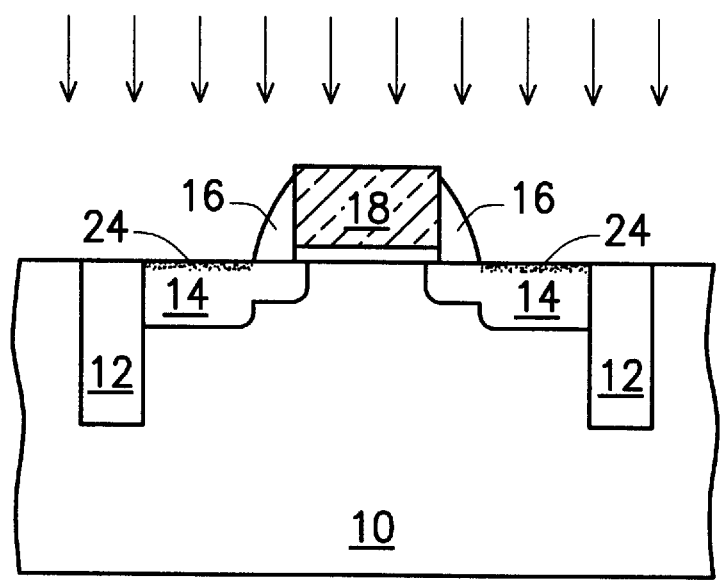
Figure 1C:
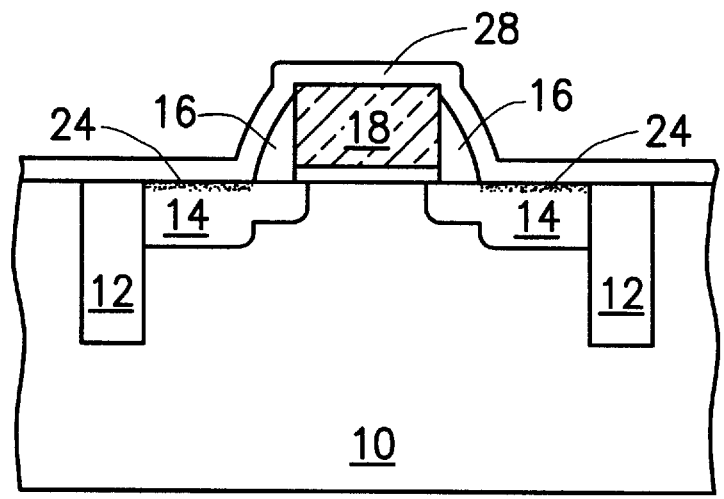
Figure 1D:
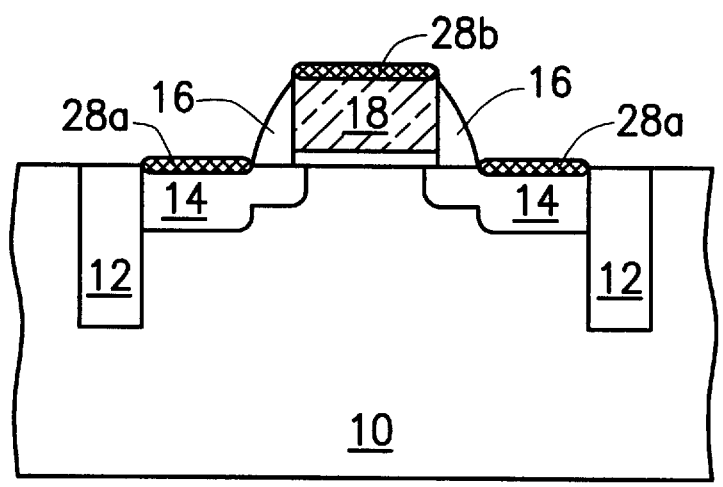
Figure 2A:
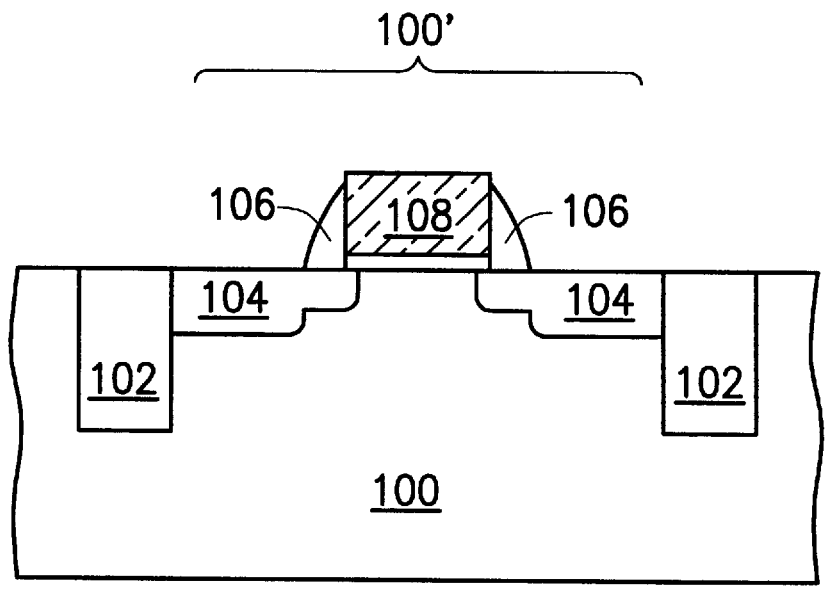
FIGS. 2A to 2C are cross-sectional views showing the process steps for reducing the sheet resistance of the source/drain regions by using a salicide process with a self-preamorphization step according to the present invention.
Figure 2B:
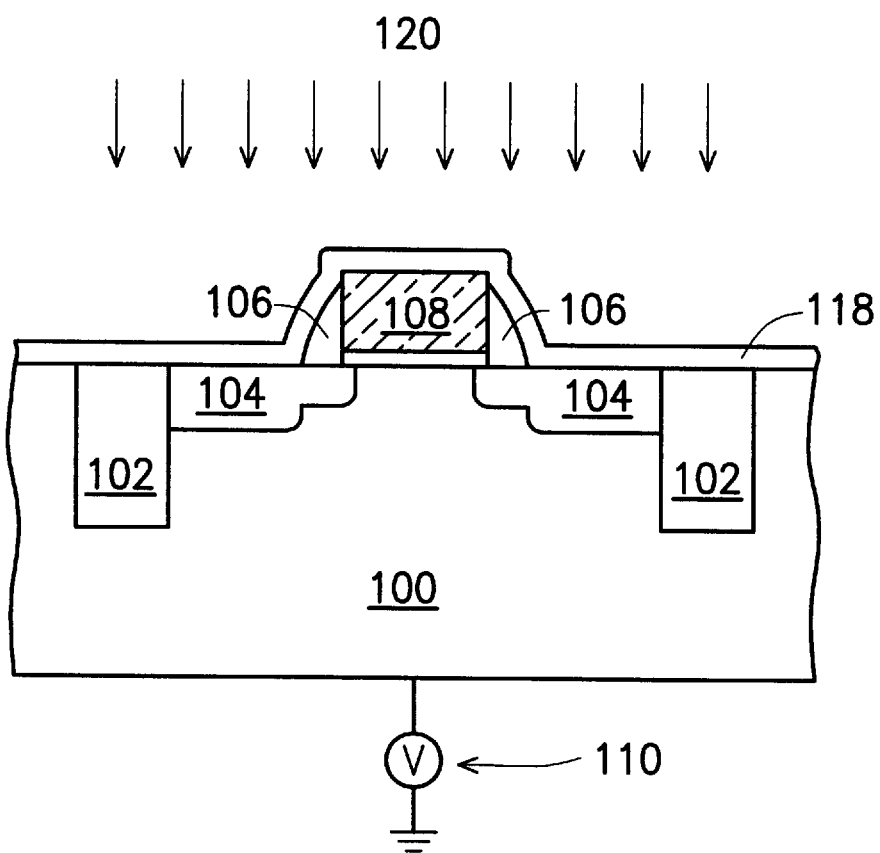
Figure 2C:
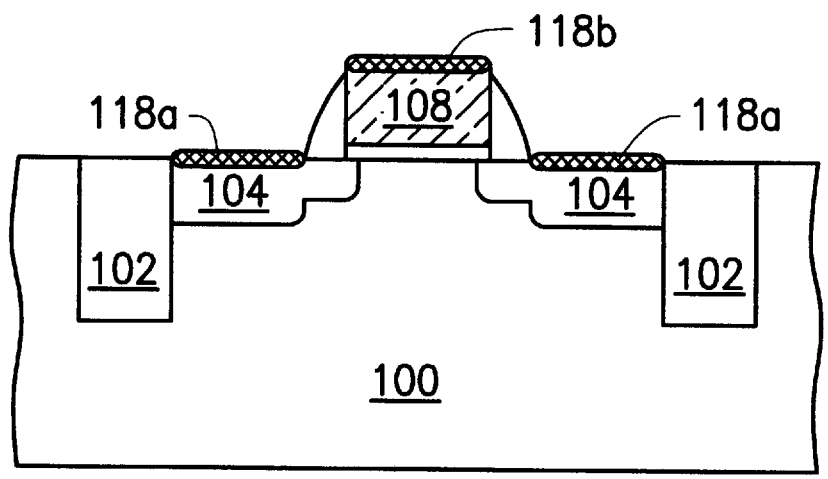

FIGS. 2A to 2C are cross-sectional views showing the process steps for reducing the sheet resistance of the source/drain regions by using a salicide process with a self-preamorphization step according to the present invention.

Referring first to FIG. 2A, a semiconductor substrate 100 is provided, and shallow trench isolation regions 102 and MOS transistors 100' are formed above the substrate 100. The MOS transistors 100' includs the gate electrodes 108, spacers 106 formed around the periphery of the gate electrodes 108 and source/drain regions 104 formed near the surface of the substrate and around the periphery of the gate electrodes 108. The spacers 106 can be made from material such as dielectric compound.

Next, in FIG. 2B, an ion metal plasma process is performed to form a layer of metal 118, for example, titanium metal, over the surfaces of the substrate 100 and gate electrodes 108. The metal can be used to form the salicide. A back bias is applied to the bottom of the substrate 100, so that the titanium ions formed by the ion metal plasma will accelerate and bombard to the surfaces of the substrate 100 and gate electrodes 108. Hence, the surfaces of the source/drain regions 104 and gate electrodes 108 are transformed into amorphous silicon, and the titanium ions are deposited on the surfaces of the substrate 100 and gate electrodes 108, so that a titanium metal layer 118 with a thickness of about 200~1000_ is simultaneously formed. The thickness of the titanium metal can be controlled, the resistance of the titanium silicide can be improved, and the sheet resistance at the interface can be reduced by the amorphous surfaces.

Figure 3:
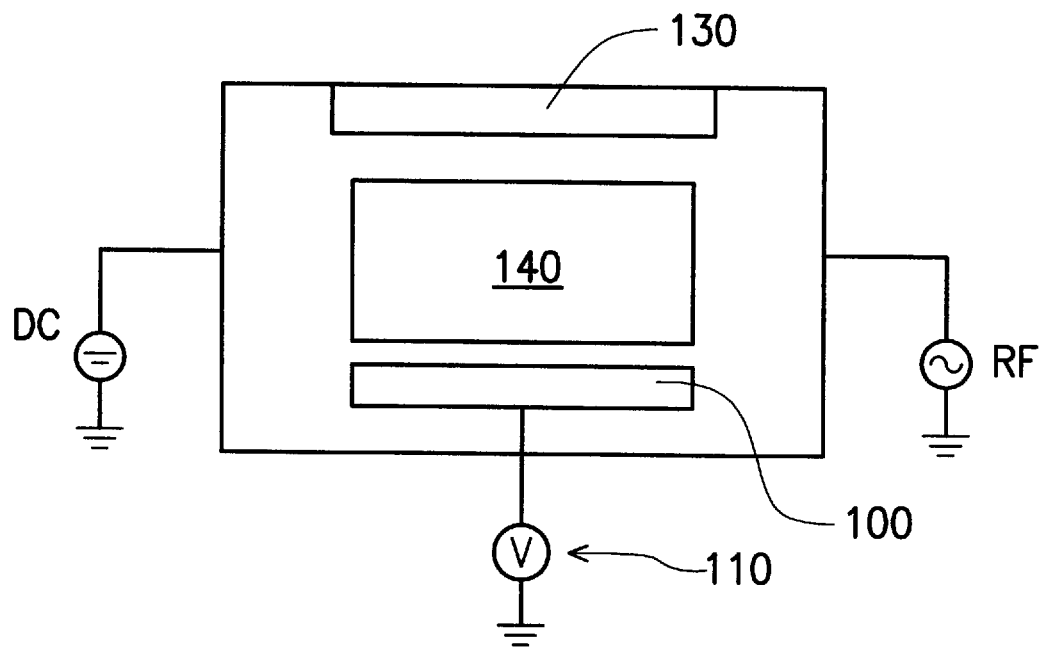
FIGS. 3 is the simplified diagram showing the equipment of ion metal plasma (IMP).

FIG. 3 is the simplified diagram showing the equipment of ion metal plasma (IMP). As shown in FIG. 3, the titanium plate is presented by the mark 130. The mark 140 is a place for producing plasma. In this equipment, after the titanium atoms are ionized, they are accelerated by a acceleration voltage to bombard to the surface of the wafer and deposited over the surface, wherein the surface of the wafer is applied by a negative voltage.

The method of depositing titanium metal in the present invention is different from the magnetically controlled DC sputtering method which is used in the conventional process. The method of the conventional process including applying a positive voltage in the position where the wafer is, using ionic argon gases to bombard to the titanium target to sputter titanium atoms, and depositing titanium atoms which are sputtered over the entire substrate structure. Therefore, it is necessary to bombard to the surface of the substrate, for example, by using other ions, for example, As or Ar ions, to transform the surface of the source/drain regions into amorphous silicon before the titanium metal is deposited. However, the method of the present invention including the combination of the amorphization step of the source/drain regions and the deposition step of titanium into one step simplifies the process and reduces the manufacturing cost.

Next, in FIG. 2C, a layer of titanium suicide is formed at the interface of the titanium and silicon, namely, a titanium silicide layer 118a is formed on the surface of the source/drain regions 104 to reduce the sheet resistance of the source/drain regions 104. A titanium silicide layer 118b is formed on the surface of the gate electrode 108 to facilitate the electrical operation of the gate electrode 108. The titanium silicide layer is formed by using a rapid thermal process having a first stage and second stage. The early formation of the titanium silicide is performed by using the rapid thermal process with the nitrogen gases and is carried out at a temperature of about 600°~750° C. in the first stage. Next, the unreacted titanium metal and titanium nitride which is formed by the reaction between the titanium metal and nitrogen gases are removed, for example, by using a RCA cleaning solution, wherein the RCA cleaning solution comprises $NH_4OH/HDIW/H_2O_2$. Then, the rapid thermal process is carried out with nitrogen gases and the temperature of the rapid thermal process is raised to a temperature of about 750°~900° C., thereby transforming a high resistance phase $C_{49}$ of the titanium nitride into a low resistance phase $C_{54}$. The titanium silicide is formed by the interactive diffusion and chemical reaction between titanium and silicon. The titanium silicide is a low resistance compound; therefore the ohmic contact formed at the interface of titanium and silicon will be excellent.

The present invention combines the amorphization step of the source/drain regions and the titanium deposition step into one step. Therefore, the manufacturing process is simplified and the manufacturing cost is reduced in the present invention.

The salicide process with the self-preamorphization step disclosed in the present invention can be applied not only to the surface of source/drain region, but to any silicon surface which is predetermined to form the salicide. The salicide is not limited to the titanium silicide; any metal which can be used to form the self-aligned silicide can also be applied in the present invention.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a self-aligned silicide with a self-preamorphization step, the silicide process being applicable to a device having a semiconductor substrate, the device comprising a device isolation region, a gate electrode, a spacer formed at a sidewall of the gate electrode and a source/drain region formed near the surface of the substrate and around the periphery of the gate electrode, comprising the steps of:

forming a metal layer over the surface of the semiconductor substrate, including the steps of applying a back bias to the bottom of the semiconductor substrate, applying a metal ion plasma to the semiconductor surface, thereby bombarding the surfaces of the gate electrode and source/drain region to form an amorphous silicon surface layer while simultaneously forming the metal layer on the surface of the semiconductor substrate; and performing a thermal process to form a silicide layer on the surfaces of the gate electrode and source/drain region.

2. A method according to claim 1, wherein the gate electrode comprises a doped-polysilicon.

3. A method according to claim 1, wherein the metal layer comprises titanium.

4. A method according to claim 1, wherein the back bias comprises a negative voltage.

5. A method according to claim 1, wherein the thermal process comprises a rapid thermal process having two stages.

6. A method according to claim 5, wherein the rapid thermal process in the first stage is performed with nitrogen gases at the temperature of about 600°~750° C.

7. A method according to claim 6, wherein after the step of performing the rapid thermal process, further comprises the substep of removing the unreacted metal in the metal layer.

8. A method according to claim 7, wherein after the step of removing the unreacted metal, further comprises the substep of using a RCA cleaning solution which comprises NH4OH/HDIW/H2O2.

9. A method according to claim 5, wherein the rapid thermal process in the second stage is performed with nitrogen gases at the temperature of about 750°~900° C.

* * * * *